United States Patent [19]

Cricchi et al.

[11] 4,109,163
[45] Aug. 22, 1978

[54] HIGH SPEED, RADIATION HARD COMPLEMENTARY MOS CAPACITIVE VOLTAGE LEVEL SHIFT CIRCUIT

[75] Inventors: James R. Cricchi, Catonsville; Michael D. Fitzpatrick, Linthicum, both of Md.

[73] Assignee: Westinghouse Electric Corp., Pittsburgh, Pa.

[21] Appl. No.: 776,805

[22] Filed: Mar. 11, 1977

[51] Int. Cl.² .................. H03K 5/02; H03K 19/08; G11C 8/00; H03K 19/34
[52] U.S. Cl. .................. 307/205; 307/215; 307/264; 307/270; 307/DIG. 1; 365/230
[58] Field of Search ............ 307/205, 208, 264, 214, 307/215, 251, 270, DIG. 1; 365/230, 231

[56] References Cited

U.S. PATENT DOCUMENTS

| | | | |
|---|---|---|---|
| 3,675,144 | 7/1972 | Zuk | 307/205 X |
| 3,716,724 | 2/1973 | Parrish et al. | 307/221 C |
| 3,823,330 | 7/1974 | Rapp | 307/DIG. 1 X |
| 3,925,689 | 12/1975 | Rubenstein | 307/DIG. 1 X |
| 3,976,984 | 8/1976 | Hirasawa | 307/DIG. 1 X |
| 4,011,471 | 3/1977 | Rocket, Jr. | 307/297 X |
| 4,016,476 | 4/1977 | Morokawa et al. | 307/DIG. 1 X |
| 4,045,691 | 8/1977 | Asano | 307/DIG. 1 X |

OTHER PUBLICATIONS

Krick, "Complementary MNOS Electronically Alterable Read-Only Memory," *IBM Tech. Discl. Bull.;* vol. 13, No. 1, pp. 263-264, 6/1970.
Chin, "Push-Pull Driver Using Bipolar and CMOS Devices," *IBM Tech. Discl. Bull.;* vol. 16, No. 11, pp. 3570-3571; 4/1974.

*Primary Examiner*—Larry N. Anagnos
*Attorney, Agent, or Firm*—H. W. Patterson

[57] ABSTRACT

A complementary MOS voltage level shift circuit which can be used as a memory buffer circuit, for example, is disclosed. The circuit utilizes both N-channel depletion mode devices and P-channel enhancement mode MOS devices preferably fabricated on silicon-on-sapphire. Both types of devices are operated with only negative or zero gate-source voltage in order to minimize threshold voltage shifts in radiation environments. A capacitive voltage level shifting technique is used to obtain push-pull operation with driver type devices in order to reduce power consumption and increase switching speed while feeding into a capacitive load. Load type devices are used to prevent discharge of a capacitive load.

15 Claims, 2 Drawing Figures

HIGH SPEED, RADIATION HARD COMPLEMENTARY MOS CAPACITIVE VOLTAGE LEVEL SHIFT CIRCUIT

STATEMENT OF GOVERNMENT INTEREST

The invention herein described was made in the course of or under Contract No. F-33651-73-C-1093 with the Department of the Air Force.

BACKGROUND OF THE INVENTION

1. Field of the Invention

The invention relates to MOS circuits and more specifically to complementary MOS voltage level shift circuits.

2. Description of the Prior Art

There are several areas, for example in MNOS memories, where a high-speed, high-voltage buffer is required. One form of such buffer incorporates all P-channel devices and has undesirable high power dissipation. In addition, since these P-channel devices dissipate so much power, they have to have small width-to-length ratios. Such devices have slower switching speeds. N-channel devices are not normally used, for example, in MNOS memories because their reverse breakdown characteristics are such that voltage swings are limited to about 15 V. Usually, a 30 V swing is required to obtain good writing characteristics in MNOS memories. Another type of buffer uses multiple clocking inputs which complicates timing considerations.

What is needed, then, is a simple, high speed, high voltage MOS memory buffer which dissipates a minimal amount of power, and whose voltage output is capable of making large swings, for example, 30 V.

SUMMARY OF THE INVENTION

The subject of the invention is a complementary MOS voltage level shift circuit preferably fabricated on silicon-on-sapphire utilizing a logic input section capacitively coupled to a voltage level shift section. The input section comprises three logic gates including a first N-channel depletion mode MOS transistor and a first and second P-channel enhancement mode MOS transistors. Each of these transistors is a driver device characterized by a large channel width-to-length ratio and large current output. Each transistor acts as a separate input element accepting logic inputs applied to their respective gates. The output of this section is the drain of the first P-channel transistor. The voltage level shift section comprises a third P-channel enhancement mode MOS transistor and a second N-channel depletion mode MOS transistor connected in a push-pull configuration. Because power is used only when switching voltage levels, this configuration uses a minimal amount of power. Both these transistors have large channel width-to-length ratios which increases switching speed. The second N-channel transistor is capacitively coupled to the input section. Three other N-channel depletion mode MOS transistors act as loads and provide sufficient current in the absence of the initial charging source to prevent any load capacitances from discharging. These N-channel transistors have small width-to-length ratios and have high impedances. They, therefore, use only a small amount of current. All MOS gate-source voltages are negative or zero in order to minimize the deleterious effects of radiation.

DESCRIPTION OF THE PREFERRED EMBODIMENT

Figure 1:
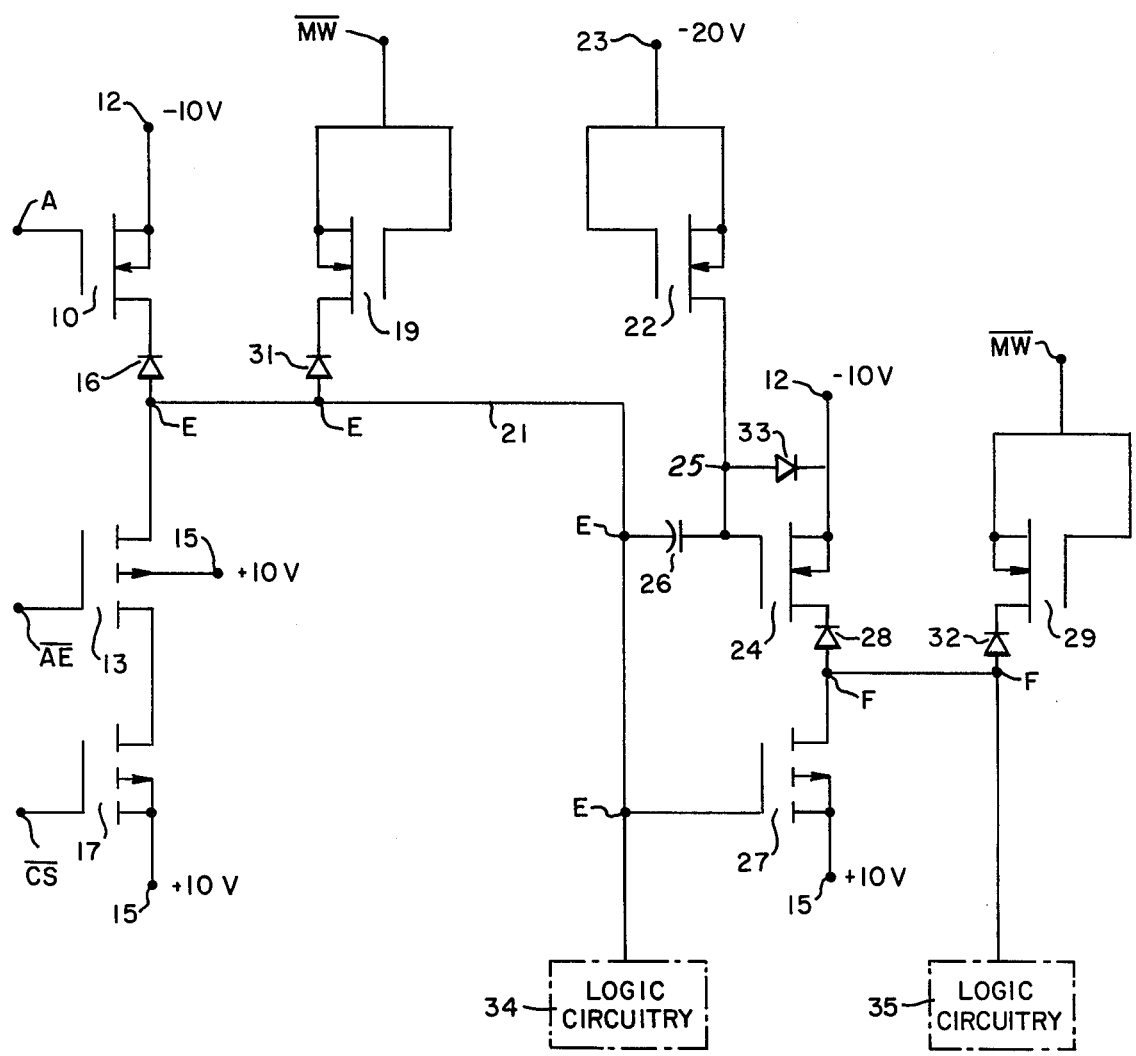
FIG. 1 is a schematic diagram of a complementary MOS voltage level shift circuit utilized as a memory buffer circuit in accordance with the teaching of the invention.

FIG. 1 is a schematic diagram of the complementary MOS memory buffer circuit utilized, for example, as a memory address enable buffer. In this particular embodiment of a memory address enable buffer, the gate of a first N-channel depletion mode MOS transistor 10 is connected to a first input node A. The source and substrate of the N-channel transistor 10 is connected to a first reference voltage 12, preferably in the range of −10V DC. The gate of a first P-channel enhancement mode MOS transistor 13 is connected to a second input node $\overline{AE}$. The substrate of the transistor 13 is connected to a second reference voltage 15, preferably in the range of +10V DC. A first diode 16 is coupled between the drain of said first N-channel transistor 10 and the drain of said first P-channel transistor 13. The gate of a second P-channel transistor 17 is connected to a third input node $\overline{CS}$, the source and substrate of the transistor 17 are connected to said reference 15; and the drain of the transistor 17 is connected to the source of said first P-channel transistor 13. The circuit of the invention, utilized as illustrated in FIG. 1, acts as a buffer between the input voltage A, $\overline{AE}$ and $\overline{CS}$ and memory circuitry represented by the dashed lines at 34 and 35.

The gate, source, and substrate of a second N-channel depletion mode MOS transistor 19 are connected to a fourth input node $\overline{MW}$, which connection turns the transistor 19 always on. A second diode 31 is coupled between the drain of the P-channel transistor 13 and the N-channel transistor 19. Potentials to the input nodes A, $\overline{AE}$, $\overline{CS}$, and $\overline{MW}$ are supplied by logic circuitry external to the circuit of the invention.

The gate, source, and substrate of a third N-channel depletion mode MOS transistor 22 are connected to a third reference voltage 23, preferably in the range of −20V, which connection turns the transistor 22 always on. The drain of the N-channel transistor 22 is connected to the gate of a fourth N-channel depletion mode MOS transistor 24. The source and substrate of the N-channel transistor 24 are connected to the reference voltage 12. A third diode 33 is coupled between the source and the gate of the N-channel transistor 24.

A capacitor 26 is coupled between the gate of the N-channel transistor 24 and the gate of a third P-channel enhancement mode MOS transistor 27. The source and substrate of the transistor 27 are connected to the reference voltage 15. A fourth diode 28 is coupled between the drain of the P-channel transistor 27 and the drain of the N-channel transistor 24. A line 21 couples the drain of the P-channel transistor 13 and the gate of the P-channel transistor 27.

The gate, source, and substrate of a fifth N-channel depletion mode MOS transistor 29 are connected to the input voltage MW which connection turns the transistor 29 always on. A fifth diode 32 is coupled between the drain of the P-channel transistor 27 and the N-channel transistor 29.

Figure 2:
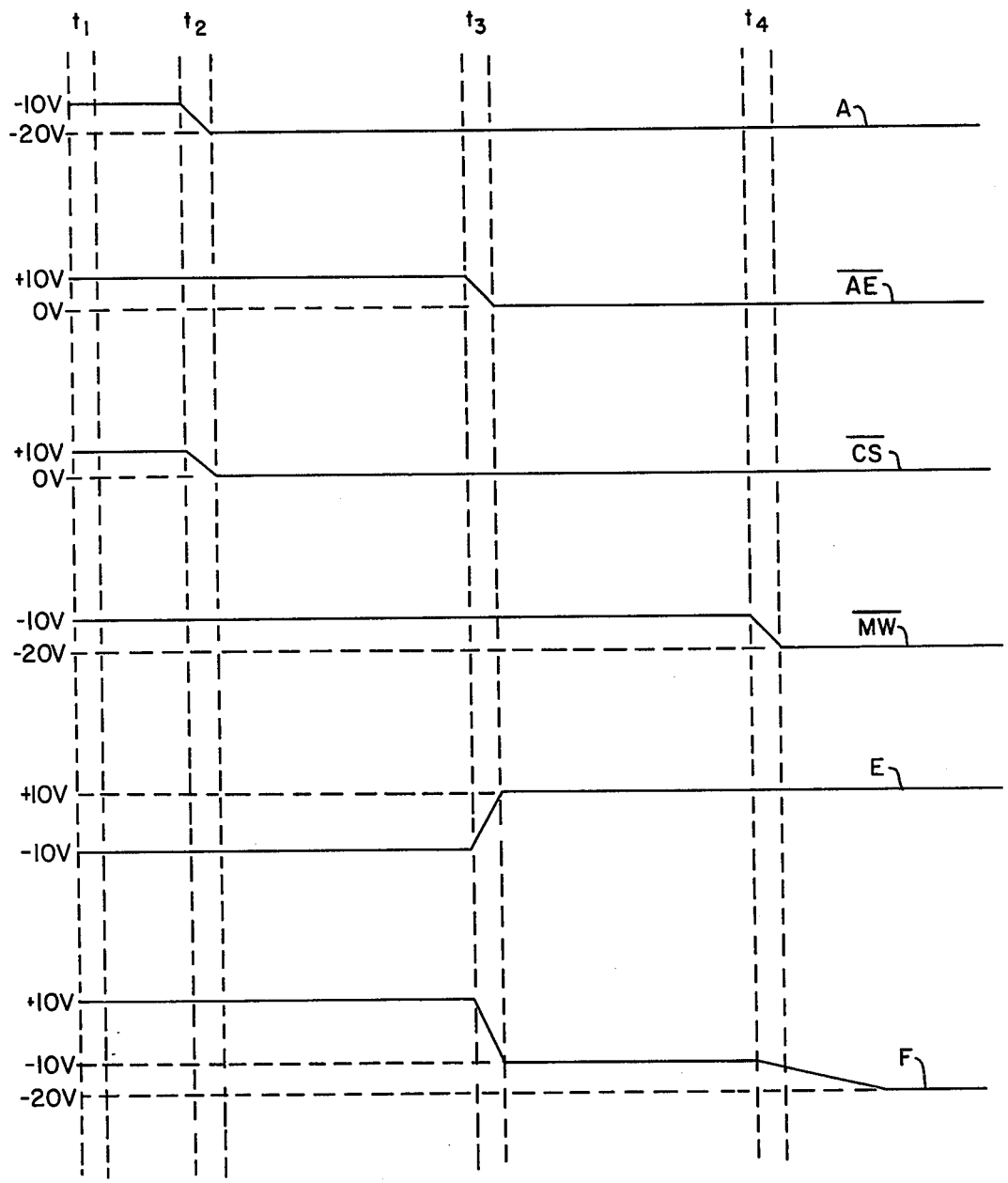
FIG. 2 is a timing diagram showing typical operating conditions of the buffer circuit of FIG. 1.

FIG. 2 is a timing diagram illustrative of a typical operating cycle of the invention utilized as an address enable memory buffer circuit, for example. The waveform, A, $\overline{AE}$, $\overline{CS}$, $\overline{MW}$, E and F in FIG. 2 refer to similar characters in FIG. 1.

The operation of the circuit illustrated in FIG. 1 will be described in connection with the timing diagram of FIG. 2. In a typical operating cycle of an address enable buffer, initially, a potential of +10V DC is applied to the nodes $\overline{AE}$ and $\overline{CS}$ and a potential of −10V DC is applied to the nodes A and $\overline{MW}$ by means external to the circuit of the invention.

Under the above conditions, the transistors 13 and 17 are turned OFF and the transistor 10 is turned ON. Since the diode 16 is forward biased, the node E is charged to −10 V from the reference voltage 12 through the transistor 10. The charging of the node E to −10 V feeds through the capacitor 26 insuring that the transistor 24 is OFF with the aid of the transistor 22 which is charging the node 25 to −20 V since transistor 22 is always ON. At the same time, this charging of the node E to −10 V turns the transistor 27 ON, which pulls the node F to +10 V. So, after a period of time $t_1$ node E is charged to −10 V as shown in FIG. 2 by the waveform E, the transistor 24 is OFF, the transistor 27 is turned ON, and the node F, which is the circuit output, is at +10 V as shown in FIG. 2 by the waveform F.

When the voltage at the node A changes to −20 V and the voltage at $\overline{CS}$ changes to 0 V, as shown at $t_2$ in FIG. 2, the transistor 10 turns OFF and the transistor 17 turns ON. But, since the transistor 13 is still OFF, the node E remains charged to −10 V as shown by waveform E. In the absence of the large charging current provided by the transistor 10, the transistor 19 provides a smaller current to prevent the load capacitances at the node E from discharging and thereby disturbing the logic operation of the buffer.

When the voltage at the node $\overline{AE}$ changes to 0 V, as shown in FIG. 2 by the waveform $\overline{AE}$ at time $t_3$, the transistor 13 turns ON which pulls the node E to +10 V through the transistors 13 and 17. After this time, $t_3$, there is a current path from the input voltage $\overline{MW}$, through the transistors 19, 13, and 17 to the reference voltage 15. Because the transistor 19 has a small channel width-to-length ratio, it presents a high impedance to current. Therefore, only a very small current flows in this path, which current causes the node E to be at slightly less than +10 V. When the node E goes to +10 V, the transistor 27 turns OFF and the positive feed-through of the +10 V through the capacitor 26 turns ON the transistor 24. The diode 33 clamps the voltage at the node 25 to approximately −10 V to keep the gate-source bias of the transistor 24 non-positive. The capacitor 26 provides AC coupling but blocks any DC path between the nodes E and the node 25. This push-pull action between the transistors 24 and 27 provides for low power switching. Also, the large channel width-to-length ratio of the transistors 24 and 27 provides for increased switching speed. When the transistor 24 turns ON, the reference voltage 12 charges the node F, the circuit output, to −10 V since the diode 28 is forwrd biased.

When the input voltage $\overline{MW}$ is changed to −20 V as shown by the waveform $\overline{MW}$ at $t_4$ in FIG. 2, the node F charges to −20 V since the transistor 29 is always ON. The node E remains at +10 V, however, because of the high impedance of the transistor 19. As shown by waveform F, the node F charges slowly to −20 V. This is because the transistor 29 which is the charging source provides a smaller amount of charging current than does the transistor 24 which is the initial charging source. The transistor 29 also provides a small current to prevent the nodal capacitances at the node F from discharging in the absence of the large charging current provided by the transistor 24.

In summary, we see that the output of the buffer, node F, as shown in FIG. 2 by the waveform F, makes a 30 V swing from a +10 V to a −20 V in response to a sequence of voltage swings at the inputs A, $\overline{AE}$, $\overline{CS}$, and $\overline{MW}$. The push-pull action of the driving transistors 24 and 27 achieves this voltage swing speedily using minimal power. In addition, the use of only negative gate-source potentials minimizes the degrading effects of radiation on the logic performance of the circuit shown in FIG. 1. The waveforms in FIG. 2 used to illustrate the operation of the circuit of the invention are typical waveforms observed in a write mode.

When it is desired that the particular section of memory to which the circuit of the invention is connected not be used, the circuit is put in a standby condition by applying a potential of −10 V to the node A, a potential of 0 V to the node $\overline{AE}$, and a potential of preferably, +10 V to the node $\overline{MW}$. A potential of +10 V applied to the node $\overline{MW}$ reverse biases the diodes 31 and 32 and presents an even higher impedance to current flow through the transistors 19 and 29, respectively. Thus, in the standby mode, the transistors 19 and 29 consume very little current.

It is to be understood that the circuit described in the invention would work even faster if the fifth N-channel transistor 29 were operated with a positive gate-source bias, but such a bias would diminish the radiation protection provided by the non-positive gate-source bias. Also, other logic high and low levels could be used as logic inputs by suitable adjustment to the various reference voltages utilized by the buffer.

What we claim is:

1. A complementary MOS voltage level shift circuit comprising:
    an input stage having a plurality of MOS transistor inputs and an output, said input stage operative to generate, in response to a sequence of input signals applied to said transistor inputs, a first voltage swing of a first predetermined amount between a positive voltage potential and a first negative voltage potential, said input stage having a first section including a first N-channel depletion mode MOS transistor coupled to said first negative voltage potential and a second section including a first P-channel enhancement mode MOS transistor coupled to said positive potential;
    a first voltage potential limiting means coupling said first and second sections and coupled to the output of said input stage;
    a voltage level shift stage having an input, said input coupled to the output of said input stage, said shift stage including two MOS transistors operatively coupled in a push-pull configuration to alternately turn ON and OFF in a coordinated manner in response to said first voltage swing to generate a second voltage swing of a second predetermined amount greater than the first predetermined amount of said first voltage swing;
    DC blocking means coupling one of the transistors in said shift stage to the input of said shift stage.

2. The circuit of claim 1 wherein:

(a) said first N-channel depletion mode transistor has a gate, a source, a drain, and a substrate connection, the gate of said first N-channel transistor comprising an input of said input stage, said source and substrate of said first N-channel transistor coupled to said first negative voltage potential, (b) said first enhancement mode MOS transistor, has a source, a gate, a drain, and a substrate connection, the gate of said first P-channel transistor comprising an input of said input stage, a first potential limiting means coupling the drains of said first P-channel transistor and said first N-channel transistor, the drain of said first P-channel transistor being coupled to the output of said input stage, the source and the substrate of said first P-channel transistor coupled to said positive voltage potential.

3. The circuit of claim 2 wherein said potential limiting means coupling the drains of said first P-channel transistor and said first N-channel transistor includes a diode.

4. The circuit of claim 2 further including: a second P-channel enhancement mode transistor having a source, a gate, a drain, and a substrate connection, the gate of said second P-channel transistor being an input of said input stage, the source of said first P-channel transistor being coupled to the drain of said second P-channel transistor operative to produce a logic NOR function at the drain of said first P-channel transistor of input signals applied to said first and second P-channel transistors, the source and the substrate of said second P-channel transistor and the substrate of said first P-channel transistor coupled to said positive voltage potential.

5. The circuit of claim 1 wherein the two transistors in said level shifting means include a second N-channel depletion mode MOS transistor and a second P-channel MOS transistor each having a drain, a source, a gate, and a substrate connection, DC blocking means coupling said gates of said second N-channel transistor and said second P-channel transistor for blocking a DC signal, second potential limiting means coupling said drains of said second N-channel transistor and said second P-channel transistor, said source and substrate of said second P-channel transistor coupled to said positive voltage potential, said source and substrate of said second N-channel transistor coupled to said first negative potential, said gate of said second P-channel transistor coupled to the input of said level shifting means, said drain of said second N-channel transistor coupled to the output of said level shifting means.

6. The circuit of claim 5 wherein said means for blocking a DC signal includes a capacitor.

7. The circuit of claim 5 wherein said second potential limiting means includes a diode.

8. The circuit of claim 5 wherein said level shifting means additionally includes a third potential limiting means coupling the gate and the source of said second N-channel transistor.

9. The circuit of claim 8 wherein said third potential limiting means includes a diode.

10. The circuit of claim 8 wherein said level shifting means additionally includes, first and second current source means, a fourth potential limiting means coupling said first current source means to the input of said level shifting means, a fifth potential limiting means coupling said second current source means to the output of said level shifting means, a sixth potential limiting means having, means coupling said sixth potential limiting means to the gate of said second N-channel transistor.

11. The circuit of claim 10 wherein said first and second current source means each includes third and fourth N-channel depletion mode MOS transistors each having a source, a gate, a drain, a substrate connection, said source, gate and substrate of each of said third and fourth N-channel transistors coupled to a variable reference potential, said drain of said third N-channel transistor coupled to said fourth potential limiting means, said drain of said fourth N-channel trnsistor coupled to said fifth potential limiting means.

12. The circuit of claim 11 wherein said fourth and fifth potential limiting means each includes a diode.

13. The circuit of claim 11 wherein the channel width-to-length ratio of each of said third and fourth N-channel transistors is in the range of one-to-one to 10-to-one.

14. The circuit of claim 10 wherein said sixth potential limiting means includes a third N-channel depletion mode MOS transistor having a source, a gate, a drain, a substrate connection, said source, gate, and substrate coupled to a third reference potential, said drain of said third N-channel transistor coupled to said means coupling said sixth potential limiting means to the gate of said second N-channel transistor.

15. The circuit of claim 14 wherein the channel width-to-length ratio of said fifth N-channel transistor is on the order of one-to-10.

* * * * *